United States Patent
Lin et al.

(10) Patent No.: US 11,874,313 B2
(45) Date of Patent: Jan. 16, 2024

(54) PROBE CARD AND MANUFACTURING METHOD THEREOF

(71) Applicant: MPI Corporation, Hsinchu County (TW)

(72) Inventors: Chin-Yi Lin, Hsinchu County (TW); Che-Wei Lin, Hsinchu County (TW); Ting-Ju Wu, Hsinchu County (TW); Chien-Kai Hung, Hsinchu County (TW)

(73) Assignee: MPI CORPORATION, Hsinchu County (TW)

( * ) Notice: Subject to any disclaimer, the term of this patent is extended or adjusted under 35 U.S.C. 154(b) by 142 days.

(21) Appl. No.: 17/518,311

(22) Filed: Nov. 3, 2021

(65) Prior Publication Data
US 2022/0170961 A1 Jun. 2, 2022

(30) Foreign Application Priority Data
Nov. 30, 2020 (TW) ................. 109142123

(51) Int. Cl.
*G01R 3/00* (2006.01)
*G01R 1/073* (2006.01)

(52) U.S. Cl.
CPC ........... *G01R 3/00* (2013.01); *G01R 1/07342* (2013.01)

(58) Field of Classification Search
CPC ...... G01R 1/06722; G01R 1/06; G01R 1/067; G01R 1/06705; G01R 1/06711; G01R 1/06716; G01R 1/06727; G01R 1/06733; G01R 1/06738; G01R 1/06744; G01R 1/0675; G01R 1/06755; G01R 1/06761; G01R 1/06766; G01R 1/06772; G01R 1/06777; G01R 1/073; G01R 1/07307; G01R 1/07314; G01R 1/07321; G01R 1/07328; G01R 1/07335; G01R 1/07342; G01R 1/0735; G01R 1/07357; G01R 1/07364; G01R 1/07371; G01R 1/07378; G01R 1/07385; G01R 1/07392; G01R 3/00
See application file for complete search history.

(56) References Cited

U.S. PATENT DOCUMENTS

| | | | |
|---|---|---|---|
| 2006/0154497 A1* | 7/2006 | Amemiya | G01R 1/07314 439/66 |
| 2013/0069680 A1* | 3/2013 | Duckworth | H05K 3/4046 324/754.03 |

FOREIGN PATENT DOCUMENTS

| | | | |
|---|---|---|---|
| TW | 201323884 A1 | 6/2013 | |
| TW | 201508289 A | 3/2015 | |

* cited by examiner

*Primary Examiner* — Lee E Rodak
(74) *Attorney, Agent, or Firm* — Birch, Stewart, Kolasch & Birch, LLP (57) ABSTRACT

A probe card and a manufacturing method of a probe card are provided. The probe card includes a probe head, first and second substrates, a first elastic component, and a first adhesive member. The second substrate is disposed between the probe head and the first substrate, and is disposed on the first substrate. The second substrate faces the first substrate and includes second contacts. The second contacts are electrically connected to first contacts of the first substrate. The first elastic component is disposed between the first substrate and the second substrate, and disposed at an outer side of the second contacts. The first adhesive member is disposed on the first substrate, annularly arranged on the side surface of the second substrate, and disposed at an outer side of the first elastic component.

11 Claims, 8 Drawing Sheets

PROBE CARD AND MANUFACTURING METHOD THEREOF

CROSS-REFERENCE TO RELATED APPLICATION

This non-provisional application claims priority under 35 U.S.C. § 119(a) to Patent Application No. 109142123 in Taiwan, R.O.C. on Nov. 30, 2020, the entire contents of which are hereby incorporated by reference.

BACKGROUND

Technical Field

The instant disclosure relates to a probe card and a manufacturing method of probe card.

Related Art

Figure 1A:
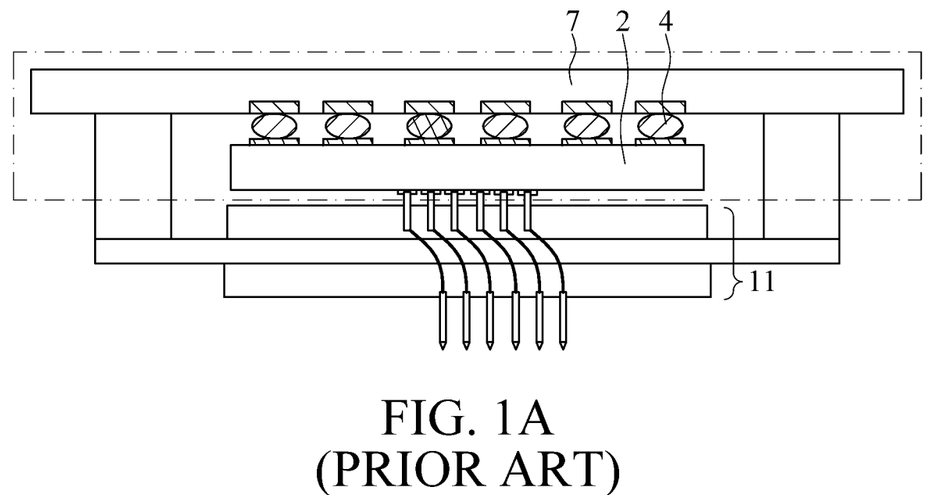
FIG. 1A illustrates a schematic static view of a probe card known to the inventor.
Figure 1B:
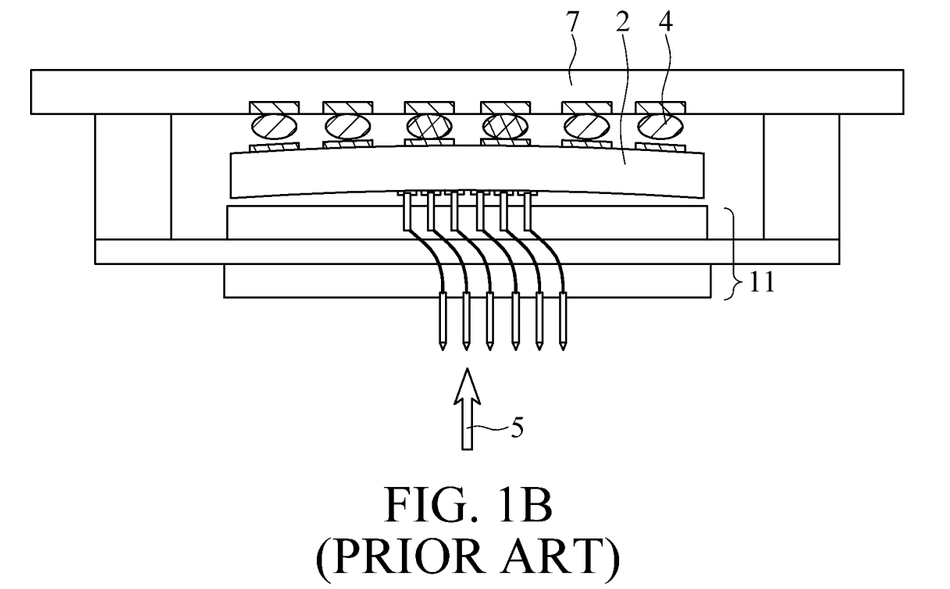
FIG. 1B illustrates a schematic operational view of the probe card known to the inventor.

Probe card is a signal transmission interface between the testing device and the device under test (DUT). For some of the probe card products involving soldering procedures, when the probe of the probe head of the probe card contacts the device under test, the probe head suffers the normal force generated on the contact surface. As a result, the soldering contacts on the substrate of the probe card is broken. FIG. 1A illustrates a schematic static view of a probe card known to the inventor. As shown, the probe card manufactured by a soldering procedure known to the inventor includes a testing circuit board 7, a substrate 2, and a probe head 11. The substrate 2 is soldered on the testing circuit board 7 through solder balls to form a plurality of soldering contacts 4. FIG. 1B illustrates a schematic operational view of the probe card known to the inventor. As shown in FIG. 1B, when the probe of the probe head 11 contacts the device under test to suffer the normal force 5, the substrate 2 connected to the probe head 11 is bent, so that the soldering contacts 4 at a periphery of the substrate 2 suffer an extension stress along a vertical direction as shown in the figure. Accordingly, the soldering contacts 4 at the periphery of the substrate 2 will be broken, thereby making the signal transmission loop be short-circuited.

SUMMARY

Figure 2A:
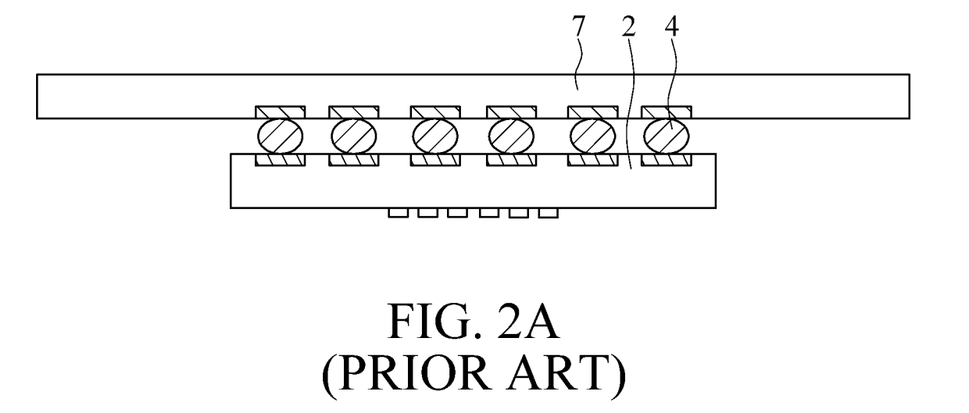
FIG. 2A illustrates an enlarged partial view of the enclosed portion of the probe card shown in FIG. 1A.
Figure 2B:
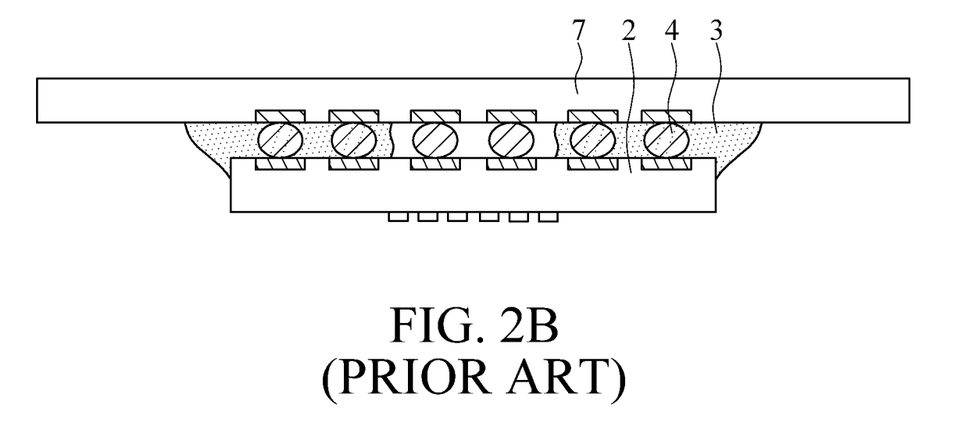
FIG. 2B illustrates a schematic view showing that the probe card shown in FIG. 1A is applied with adhesive.

FIG. 2A illustrates an enlarged partial view of the enclosed portion of the probe card shown in FIG. 1A. In order to solve the issue that the soldering contacts 4 at the periphery of the substrate 2 are prone to get broken, the inventor tried to use an adhesive 3 to position the periphery of the substrate 2. FIG. 2B illustrates a schematic view showing that the probe card shown in FIG. 1A is applied with adhesive. As shown in FIG. 2B, the adhesive 3 is adhered to the periphery of the substrate 2 to prevent the soldering contacts 4 from being broken. The function of the adhesive 3 is to fill the vertical gap between the periphery of the substrate 2 and the testing circuit board 7 to prevent the soldering contacts 4 from having cracks or being broken upon the substrate 2 is deformed. However, the adhesive 3 is prone to flow into the space between the substrate 2 and the testing circuit board 7 to enclose some of the soldering contacts 4. Therefore, in the case that the probe card is to be repaired as well as that the substrate 2 and the probe head have to be unsoldered and detached from each other, if some of the soldering contacts 4 are already enclosed and secured by the adhesive 3, the difficulty for the detaching procedure and the possibility for damaging the contacts are both increased, thus causing waste of resources and increased manufacturing costs.

In view of this, a probe card is provided. In one embodiment, the probe card comprises a probe head, a first substrate, a second substrate, a first elastic component, and a first adhesive member. The first substrate comprises an upper surface and the upper surface comprises a plurality of first contacts. The second substrate is disposed between the probe head and the first substrate, and is disposed on the upper surface of the first substrate. The second substrate comprises a lower surface and a side surface. The lower surface of the second substrate faces the upper surface of the first substrate. The lower surface of the second substrate comprises a plurality of second contacts. Each of the second contacts is electrically connected to a corresponding first contact. The first elastic component is disposed between the upper surface of the first substrate and the lower surface of the second substrate, and the first elastic component is disposed at an outer side of the second contacts of the second substrate. The first adhesive member is disposed on an upper surface of the first substrate, annularly arranged on the side surface of the second substrate, and disposed at an outer side of the first elastic component.

Moreover, a manufacturing method of a probe card is also provided. In one embodiment, the probe card comprises a first substrate, a second substrate, and a probe head. An upper surface of the first substrate comprises a plurality of first contacts. A lower surface of the second substrate comprises a plurality of second contacts. The manufacturing method comprises disposing the second substrate on the upper surface of the first substrate, wherein each of the second contacts is electrically connected to a corresponding first contact. The manufacturing method further comprises disposing a first elastic component between the first substrate and the second substrate, wherein the first elastic component is at an outer side of the second contacts of the second substrate. the manufacturing method further comprises disposing a first adhesive member on the upper surface of the first substrate, wherein the first adhesive member is annularly arranged on a side surface of the second substrate and is on an outer side of the first elastic component. Moreover, the manufacturing method further comprises solidifying the first adhesive member.

BRIEF DESCRIPTION OF THE DRAWINGS

The disclosure will become more fully understood from the detailed description given herein below for illustration only, and thus not limitative of the disclosure, wherein.

DETAILED DESCRIPTION

Figure 3A:
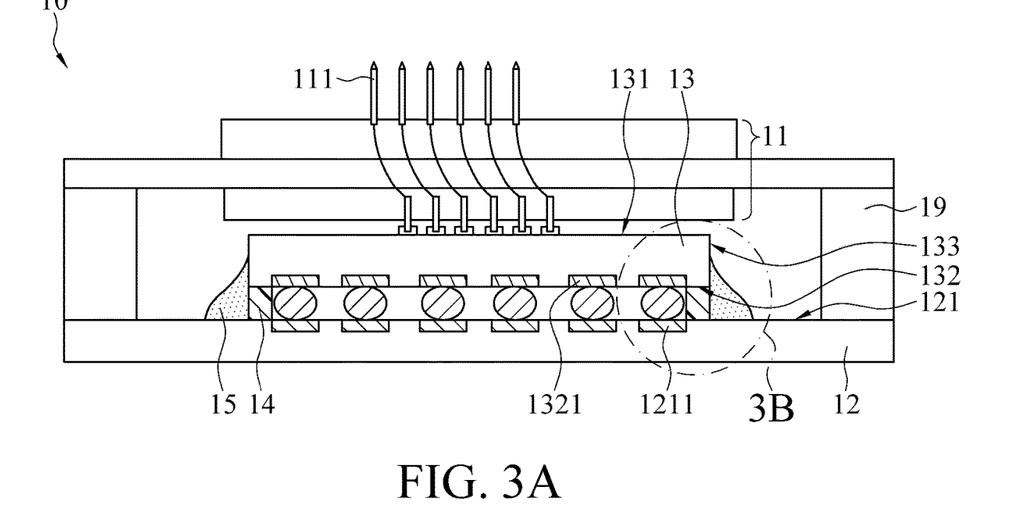
FIG. 3A illustrates a schematic view of a probe card according an exemplary embodiment of the instant disclosure.

FIG. 3A illustrates a schematic view of a probe card according an exemplary embodiment of the instant disclosure. As shown in FIG. 3A, in this embodiment, the probe card 10 comprises a probe head 11, a first substrate 12, a second substrate 13, a first elastic component 14, and a first adhesive member 15. The first substrate 12 comprises an upper surface 121. The upper surface 121 comprises a plurality of first contacts 1211. The second substrate 13 is disposed between the probe head 11 and the first substrate 12, and is disposed on the upper surface 121 of the first substrate 12. The second substrate 13 comprises a lower surface 132 and a side surface 133. The lower surface 132 of the second substrate 13 faces the upper surface 121 of the first substrate 12. The lower surface 132 of the second substrate 13 comprises a plurality of second contacts 1321. Each of the second contacts 1321 is electrically connected to a corresponding first contact 1211. The first elastic component 14 is disposed between the upper surface 121 of the first substrate 12 and the lower surface 132 of the second substrate 13, and the first elastic component 14 is disposed at an outer side of the second contacts 1321 of the second substrate 13. The first adhesive member 15 is disposed on the upper surface 121 of the first substrate 12, annularly arranged on the side surface 133 of the second substrate 13, and disposed at an outer side of the first elastic component 14.

The probe head 11 are provided with several probes 111. The probe 111 is adapted to transmit the testing signal from the testing device to the device under test and transmit the measured result feedbacked by the device under test back to the testing device. The electrical connection between the electrical contact of the probe head 11 and the electrical contact of the second substrate 13 may be, but not limited to, achieved by physically contacting, soldering, or wiring, so that the electrical signals can be transmitted between the probe head 11 and the second substrate 13. According to some embodiments, the probe head 11 is fixed on the first substrate 12 through a fixation base 19.

According to some embodiments, the first substrate 12 is a printed circuit board. The first substrate 12 comprises the upper surface 121, and the upper surface 121 comprises the first contacts 1211. According to some embodiments, the first substrate comprises a wire, and the wire is adapted to allow the signals to be transmitted between the probe card 10 and the testing device. The first contacts 1211 are in conduction with the wire. The second substrate 13 is disposed between the probe head 11 and the first substrate 12, and is disposed on the upper surface 121 of the first substrate 12, so that a multi-layer structure is formed. The second substrate 13 may be, but not limited to, a printed circuit board, a multilayer organic substrate (Multilayer Organ, MLO), or a multilayer ceramic substrate (Multilayer Polymider Ceramic, MLC). The second substrate 13 comprises the lower surface 132 and the side surface 133. The lower surface 132 of the second substrate 13 faces the upper surface 121 of the first substrate 12. The lower surface 132 of the second substrate 13 comprises a plurality of second contacts 1321. The second contact 1321 of the second substrate 13 is electrically connected to the first contact 1211 of the first substrate 12. In one embodiment, the second substrate 13 may be an MLC substrate with a higher rigidity. Therefore, during the testing, the bending of the second substrate 13 can be reduced, thus decreasing the possibility of the breaking between the second contact 1321 at the periphery of the second substrate 13 and the first contact 1211. The electrical connection between the first contact 1211 and the second contact 1321 may be, but not limited to, achieved by physically contacting, soldering, reflow soldering, or wiring. Moreover, the electrical connection is not limited to be direct connection or indirect connection through other components.

The first elastic component 14 may be, but not limited to, made of rubber, silicone, plastic, organic material, or combination of the materials. According to some embodiments, the first elastic component 14 is formed by solidifying an adhesive. The first elastic component 14 is disposed between the upper surface 121 of the first substrate 12 and the lower surface 132 of the second substrate 13. According to some embodiments, the first elastic component 14 is completely in the space between the first substrate 12 and the second substrate 13. According to some embodiments, parts of the first elastic component 14 are in the space between the first substrate 12 and the second substrate 13. The first elastic component 14 is disposed at an outer side of the second contacts 1321 of the second substrate 13. According to some embodiments, the first elastic component 14 is disposed at the outer side of all of the second contacts 1321 of the second substrate 13. In this embodiment, the sentence that "the first elastic component 14 is disposed at the outer side of the second contacts 1321" indicates that, the first elastic component 14 is not located between any of two assigned second contacts 1321. In other words, in this embodiment, the connection line of the two second contacts 1321 does not pass through the first elastic component 14. For example, in some embodiments, the second contacts 1321 are near the middle portion of the substrate, and the first elastic component is near the periphery of the outer side of the second substrate 13. Therefore, all the second contacts 1321 are surrounded by the first elastic component 14. In this embodiment, the first elastic component 14 has a first elasticity, the first adhesive member 15 has a second elasticity, and the first elasticity is greater than the second elasticity.

In some embodiments, the upper surface of the first elastic component 14 abuts against the lower surface 132 of the second substrate 13, and the lower surface of the first elastic component 14 abuts against the upper surface 121 of the first substrate 12, respectively. The first elastic component 14 is positioned between the upper surface 121 of the first substrate 12 and the lower surface 132 of the second substrate 13 through the friction between the first elastic component 14 and the first substrate 12 as well as the friction between the first elastic component 14 and the second substrate 13.

According to some embodiments, the first elastic component 14 is provided as a support for the second substrate 13 to prevent the deformation of the second substrate 13 upon the second substrate 13 is applied with an external force.

The first adhesive member 15 is disposed on the upper surface 121 of the first substrate 12 and is annularly arranged on the side surface 133 of the second substrate 13. Therefore, the first substrate 12 and the third substrate 13 can be relatively positioned with each other through the first adhesive member 15. The term "annularly arranged" may indicate to dispose around the periphery of the substrate, but not limited to, continuously arranged, arranged with a fixed interval, or arranged with unfixed intervals. The first adhesive member 15 is disposed at an outer side of the first elastic component 14. According to some embodiments, the first adhesive member 15 is adjacently connected to the first elastic component 14. According to some embodiments, the first adhesive member 15 completely covers the first elastic component 14. According to some embodiments, the first adhesive member 15 covers parts of the first elastic component 14. According to some embodiments, when the first adhesive member 15 is in the fluid state (before being solidifying), the fluid-state first adhesive member 15 is blocked by the first elastic component 14 and cannot flow close to the second contacts 1321 (or the first contacts 1211) between the first substrate 12 and the second substrate 13. Therefore, the first adhesive member 15 can be prevented from flowing into the position near the first contacts 1211 or the position near the second contacts 1321. It is understood that, once the adhesive flows into the portion near the contacts, the unsoldering and detaching procedure for the first substrate 12 and the second substrate 13 will be difficult, and the first contacts 12111 or the second contacts 1321 will have apparent damages. According to some embodiments, the first elastic component 14 has a first expansion coefficient, the first adhesive member 15 has a second expansion coefficient, and the first expansion coefficient is less than or equal to the second expansion coefficient. Accordingly, in this embodiment, in the temperature rising process for the testing environment, the probe card 10 will not have excessive deformation to lift up the second substrate 13. With the consideration that the first adhesive member 15 is attached to the second substrate 13, the first adhesive member 15 should have a proper affinity to the surface of the first substrate 12 or the second substrate 13; further, the first adhesive member 15 should have a lower flowability to allow the first adhesive member 15 to form an inclined plane before being solidified, so that the first adhesive member 15 can be properly attached to the first substrate 12 or the second substrate 13. Therefore, according to some embodiments, a first adhesive force is between the first elastic component 14 and the second substrate 13, a second adhesive force is between the first adhesive member 15 and the second substrate 13, and the first adhesive force is less than the second adhesive force. Furthermore, as described in the foregoing embodiments, the first elastic component 14 may be formed by solidifying an adhesive. Therefore, the first elastic component has a first adhesive force. When the first elastic component 14 is disposed between the first substrate 12 and the second substrate 13, the first elastic component 14 is adhered to the upper surface 121 of the first substrate 12 and the lower surface 132 of the second substrate 13, indicating that there is no gap between the first substrate 12 and the first elastic component 14, and between the second substrate 13 and the first elastic component 14. Hence, during the disposing the first adhesive member 15 on the first substrate 12, the first adhesive member 15 is blocked by the first elastic component 14 and does not flow into or flow into the space formed between the first substrate 12 and the second substrate 13. In order to ensure that the first adhesive member 15 is adhered to the second substrate 13 to prevent the deformation of the second substrate 13 upon the second substrate 13 is applied with an external force, the second adhesive force should be large enough. Moreover, in order to allow the first substrate 12 and the second substrate 13 to be detached from each other for repairment (for example, to allow the first substrate 12 and the second substrate 13 to be detached from each other by unsoldering procedures), the first adhesive force between the first elastic component 14 and the second substrate 13 should be small enough to reduce the difficulty for the detaching procedure and to prevent the first substrate 12 or the second substrate 13 from getting damaged.

Figure 4:
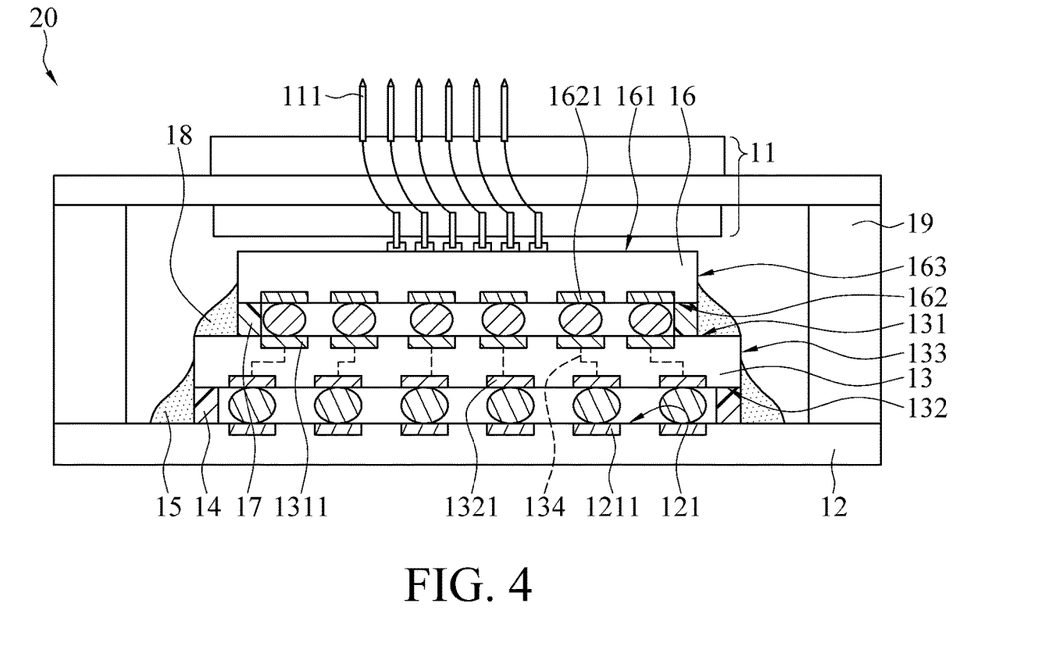
FIG. 4 illustrates a schematic view of a probe card according to another exemplary embodiment of the instant disclosure.

FIG. 4 illustrates a schematic view of a probe card according to another exemplary embodiment of the instant disclosure. As shown in FIG. 4, in this embodiment, the probe card 20 comprises a probe head 11, a first substrate 12, a second substrate 13, a third substrate 16, a first elastic component 14, a second elastic component 17, a first adhesive member 15, and a second adhesive member 18. The second substrate 13 comprises an upper surface 131, a lower surface 132, a side surface 133, and internal wires 134. The upper surface 131 of the second substrate 13 comprises a plurality of fourth contacts 1311. The third substrate 16 is disposed between the probe head 11 and the second substrate 13, and is disposed on the upper surface 131 of the second substrate 13. Therefore, in this embodiment, a multilayered structure comprising the first substrate 12, the second substrate 13, the third substrate 16, and the probe head 11 is formed. The third substrate 16 may be, but not limited to, a printed circuit board, an MLO, or an MLC. The third substrate 16 comprises an upper surface 161, a lower surface 162, and a side surface 163, and the lower surface 162 of the third substrate 16 faces the upper surface 131 of the second substrate 13. The lower surface 162 of the third substrate 16 comprises a plurality of third contacts 1621, and third contact 1621 of the third substrate 16 is electrically connected to the fourth contact 1311 of the second substrate 13. The internal wire 134 of the second substrate 13 is electrically connected to the second contact 1321 of the second substrate 13 and the fourth contact 1311 of the second substrate 13. Therefore, the first contact 1211 of the first substrate 12, the second contact 1321 of the second substrate 13, the fourth contact 1311 of the second substrate 13, and the third contact 1621 of the third substrate 16 are in conduction with each other to transmit electrical signals. According to some embodiments, two internal wires 134 in the second substrate 13 are in conduction with two second contacts 1321 and two fourth contacts 1311 separately, and the spacing between the two adjacent second contacts 1321 is greater than the spacing between the two adjacent fourth contacts 1311. Therefore, through spacing adjustment, the original spacing between the probes 111 can be enlarged to correspond to the spacing of the first contacts 1211 of the first substrate 12 of the probe card 20. According to some embodiment, the spacing between the two adjacent second contacts 1321 of the second substrate 13 is greater than the spacing between the two adjacent fourth contacts 1311 of the second substrate 13. According to some embodiments, the third substrate 16 is electrically connected to the probe head 11, and the third substrate 16 also has internal wires for adjusting the spacing between contacts. Therefore, the third substrate 16 can be provided for rearranging the contacts.

The second elastic component 17 may be, but not limited to made of rubber, silicone, plastic, organic material, or combination of the materials. According to some embodiments, the second elastic component 17 is formed by solidifying an adhesive. The second elastic component 17 is disposed between the upper surface 131 of the second substrate 13 and the lower surface 162 of the third substrate 16. According to some embodiments, the second elastic component 17 is completely in the space formed between the second substrate 13 and the third substrate 16. According to some embodiments, parts of the second elastic component 17 is in the space formed between the second substrate 13 and the third substrate 16. The second elastic component 17 is disposed at an outer side of the third contacts 1621 of the third substrate 16. According to some embodiments, the second elastic component 17 is disposed at the outer side of all of the third contacts 1621 of the third substrate 16.

In some embodiments, the upper surface of the second elastic component 17 abuts against the lower surface 162 of the third substrate 16, and the lower surface of the second elastic component 17 abuts against the upper surface 131 of the second substrate 13, respectively. The second elastic component 17 is positioned between the upper surface 131 of the second substrate 13 and the lower surface 162 of the third substrate 16 through the friction between the second elastic component 17 and the second substrate 13 as well as the friction between the second elastic component 17 and the third substrate 16.

According to some embodiments, the second elastic component 17 is provided as a support for the third substrate 16 to prevent the deformation of the third substrate 16 upon the third substrate 16 is applied with an external force.

Figure 5:
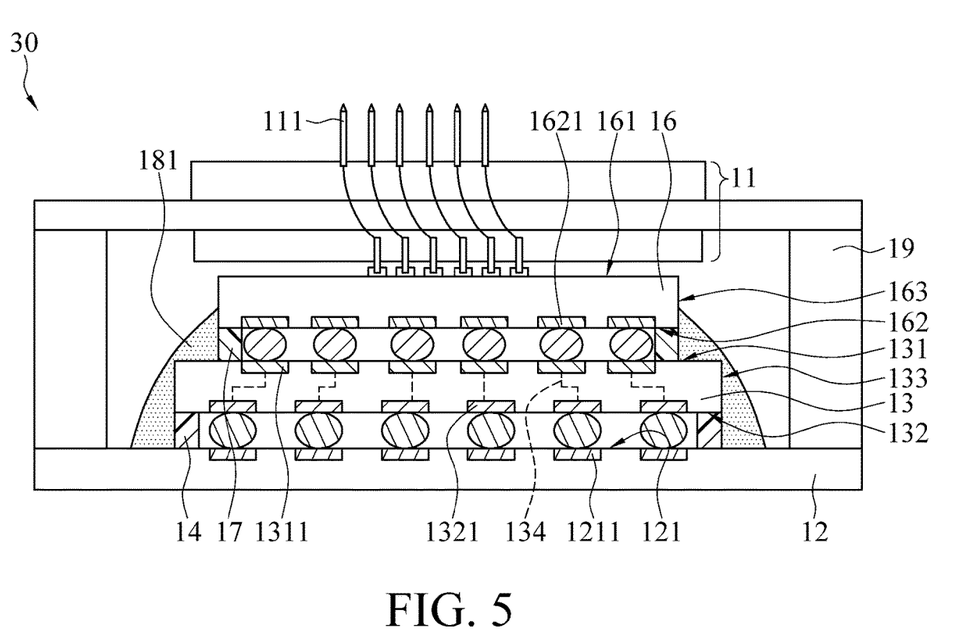
FIG. 5 illustrates a schematic view showing an exemplary configuration of a third adhesive member of a probe card according to an exemplary embodiment of the instant disclosure.

The second adhesive member 18 is disposed on the upper surface 131 of the second substrate 13 and is annularly arranged on the side surface 163 of the third substrate 16. Therefore, the second substrate 13 and the third substrate 16 can be relatively positioned with each other through the second adhesive member 18. According to some embodiments, the second adhesive member 18 is adjacently connected to the second elastic component 17. According to some embodiments, the second adhesive member 18 completely covers the second elastic component 17. According to some embodiments, the second adhesive member 18 covers parts of the second elastic component 17. FIG. 5 illustrates a schematic view showing an exemplary configuration of a third adhesive member of a probe card according to an exemplary embodiment of the instant disclosure as shown in FIG. 5, according to the probe card 30 of some embodiments, the first adhesive member 15 and the second adhesive member 18 are made of the same material, and the first adhesive member 15 is connected to the second adhesive member 18 to form a third adhesive member 181.

Figure 6:
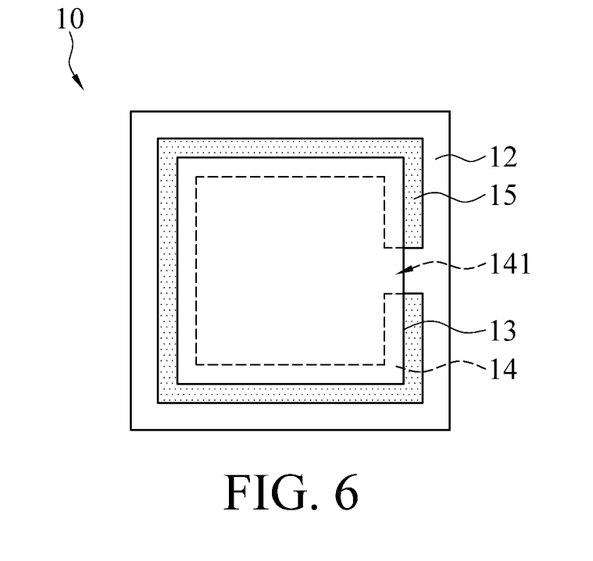
FIG. 6 illustrates a schematic view showing an exemplary configuration of a first elastic component and a first adhesive member of a probe card according to an exemplary embodiment of the instant disclosure.

FIG. 6 illustrates a schematic view showing an exemplary configuration of a first elastic component and a first adhesive member of a probe card according to an exemplary embodiment of the instant disclosure. As shown in FIG. 6, the first elastic component 14 comprises a first through hole 141, and the atmosphere is in communication with the space formed between the first substrate 12 and the second substrate 13. According to some embodiments, in order to allow the probe card 10 to be disassembled for repairment, the first elastic component 14 blocks the first adhesive member 15 from flowing into the space formed between the first substrate 12 and the second substrate 13. However, since the first adhesive member 15 cannot be filled into the space formed between the first substrate 12 and the second substrate 13, gas exists in the space between the first substrate 12 and the second substrate instead. Hence, when the probe card 10 is tested from one condition to another condition involving different temperatures (room temperature, high temperature, or low temperature), the expansion and contraction of the gas may cause the breaking of the contacts between the first substrate 12 and the second substrate 13 owing to the material fatigue of the contacts. Therefore, according to some embodiments, the first through hole 141 is provided as a channel for gas communication to prevent the contacts between the first substrate 12 and the second substrate 13 from suffering the pressure caused by the gas. According to some embodiments, the first adhesive member 15 comprises a second through hole 151, and the second through hole 151 is in communication with the first through hole 141. The first through hole 141 and the second through hole 151 may be not limited to a circular shape, and also may be not limited to be of a regular shape or an irregular shape. According to some embodiments, the hole diameter of the through hole may be the minimum internal diameter, the maximum internal diameter, or the average internal diameter. According to some embodiments, the hole diameter of the first through hole 141 may be great enough to allow the first elastic component 14 to break into separated parts.

Figure 7:
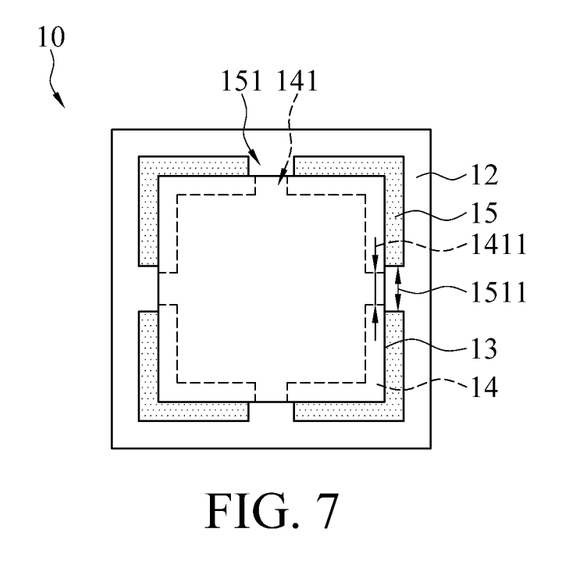
FIG. 7 illustrates a schematic view showing another exemplary configuration of the first elastic component and the first adhesive member of the probe card according to the exemplary embodiment of the instant disclosure.

According to some embodiments, the first elastic component 14 comprises a plurality of first through holes 141. FIG. 7 illustrates a schematic view showing another exemplary configuration of the first elastic component and the first adhesive member of the probe card according to the exemplary embodiment of the instant disclosure. As shown in FIG. 7, the first elastic component 14 comprises fourth first through holes 141, the first adhesive member 15 comprises four second through holes 151, and each of the first through holes 141 corresponds to and is in communication with a corresponding second through hole 151. According to some embodiments, the first adhesive member 15 comprises at least one second through hole 151 corresponding to each of the sides surfaces 133 of the second substrate 13. For example, as shown in FIG. 7, the second substrate 13 in a square shape has four sides 133, the first adhesive member 15 is annularly arranged on the four sides 133 of the second substrate 13, and the first adhesive member 15 has one second through hole 151 corresponding to each of the side surfaces 133 of the second substrate 13. According to some embodiments, the hole diameter 1511 of the second through hole 151 is greater than or equal to the hole diameter 1411 of the first through hole 141. Therefore, before the first adhesive member 15 is solidified, the unsolidified first adhesive member 15 can be prevented from flowing through the first through hole 141 to enter into the space formed between the first substrate 12 and the second substrate 13.

Figure 3B:
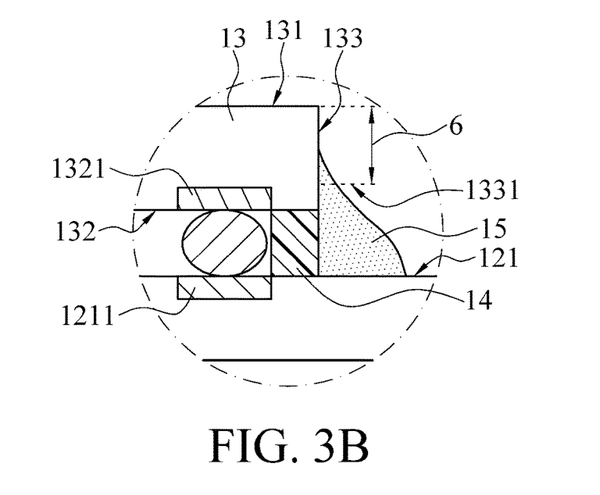
FIG. 3B illustrates an enlarged partial view of the enclosed portion of the probe card shown in FIG. 3A.

According to some embodiments, the first adhesive member 15 is attached to the side surface 133 of the second substrate 13, and a height of the first adhesive member 15 is greater than or equal to one-fourth of a height of the side surface 133 of the second substrate 13 and is less than or equal to a height of the upper surface 131 of the second substrate 13. Therefore, it is ensured that the first adhesive member 15 can be firmly attached to the second substrate 13, without causing the first adhesive member 15 to be expanded to the upper surface 131 of the second substrate 13 and to be attached to the fourth contacts 1311 on the upper surface 131 of the second substrate 13. In one embodiment, the height of the first adhesive member 15 is greater than or equal to one-second of the height of the side surface 133 of the second substrate 13 and is less than or equal to the height of the upper surface 131 of the second substrate 13. FIG. 3B illustrates an enlarged partial view of the enclosed portion of the probe card shown in FIG. 3A. As shown in FIG. 3B, the height of the first adhesive member 15, from the upper surface 131 of the first substrate 12, extends toward the top portion of the first adhesive member 15 at the side surface 133 of the second substrate 13. According to some embodiments, the range 6 of the top portion of the first adhesive member 15 is greater than or equal to one-fourth of the height of the side surface 133 of the second substrate 13 (indicated as position 1331) but does not exceed the range of the upper surface 131 of the second substrate 13. For example, as shown in FIG. 3B, if the distance between the lower surface 132 of the second substrate 13 and the upper surface 121 of the first substrate 12 is 100 unit, and the height of the second substrate 13 is 100 unit, then the distance between the top portion of the first adhesive member 15 and the upper surface 121 of the first substrate 12 may be in a range between 125 and 200 unit. In one embodiment, the range 6 of the top portion of the first adhesive member 15 is greater than or equal to one-second of the side portion 133 of the second substrate 13 but does not exceed the range of the upper surface 131 of the second substrate. For example, as shown in FIG. 3B, if the distance between the lower surface 132 of the second substrate 13 and the upper surface 121 of the first substrate 12 is 100 unit, and the height of the second substrate 13 is 100 unit, then the distance between the top portion of the first adhesive member 15 and the upper surface 121 of the first substrate 12 may be in a range between 150 and 200 unit.

Figure 8:
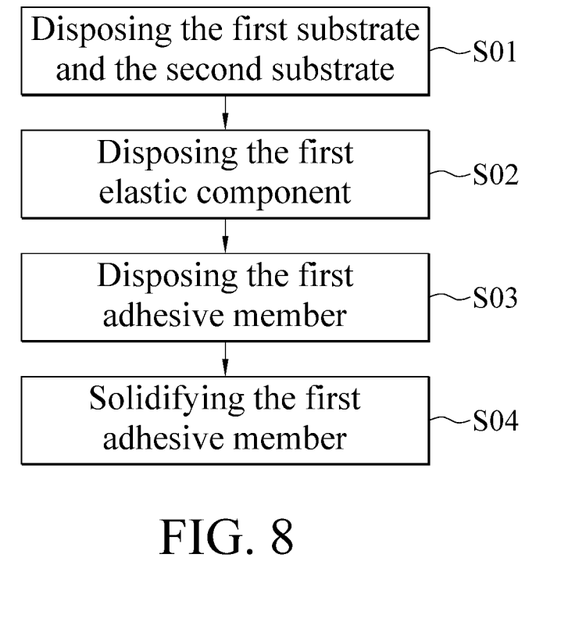
FIG. 8 illustrates a flowchart of a manufacturing method of probe card according to an exemplary embodiment of the instant disclosure.

FIG. 8 illustrates a flowchart of a manufacturing method of probe card according to an exemplary embodiment of the instant disclosure. In this embodiment, the manufacturing method comprises following steps. Firstly, disposing the second substrate 13 on the upper surface 121 of the first substrate 12 (the step S01). Then, electrically connecting the second contact 1311 of the second substrate 13 to the first contact 1211 of the first substrate. The electrical connection may be for example, but not limited to, physical contacting, soldering, reflow soldering, or wiring. Then, disposing the first elastic component 14 between the first substrate 12 and the second substrate 13, and the first elastic component 14 is disposed at the outer side of the second contacts 1321 of the second substrate 13 (the step S02). Then, disposing the first adhesive member 15 on the upper surface 121 of the first substrate 12 and annularly arranging the first adhesive member 15 on the side surface 133 of the second substrate 13 and at the outer side of the first elastic component 14 (the step S03). Therefore, the first adhesive member 15 can be blocked by the first elastic component 14 and prevented from flowing into the position near the second contacts 1321 between the first substrate 12 and the second substrate 13. Last, solidifying the first adhesive member 15 (the step S04).

According to some embodiments, the step of disposing the first elastic component 14 (the step S02) further comprises providing a first through hole 141 on the first elastic component 14. Moreover, the step of disposing the first adhesive component 15 (the step S03) further comprises providing a second through hole 151 on the first elastic component 15, so that the second through hole 151 of the first adhesive member 15 is in communication with the first through hole 141 of the first elastic component 14. According to some embodiments, the formation of the first through hole 141 may be achieved by choosing the first elastic component 14 whose length is less than the perimeter of the second substrate 13. Therefore, when the first elastic component 14 is disposed between the first substrate 12 and the second substrate 13 along the periphery of the second substrate 13, the first through hole 141 as shown in FIG. 6 can be formed accordingly. In some embodiments, for forming two first through holes 141, two first elastic components 14 can be chosen. When the two first elastic components 14 are disposed between the first substrate 12 and the second substrate 13 along the periphery of the second substrate 13, the two first elastic components 14 are spaced from each other, and two first through holes 141 can be formed accordingly. Similarly, for forming four first through holes 141 as shown in FIG. 7, four elastic components 14 can be chosen. When the four first elastic component 14 are disposed between the first substrate 12 and the second substrate 13 along the periphery of the second substrate 13, the four first elastic components 14 are spaced from one another, and four first through holes 141 can be formed accordingly. Consequently, for forming different number of the second through holes 151, in the subsequent steps, the first adhesive member 15 is applied at the outer side of the first elastic component 14 without overlapping the first through hole 141. Therefore, one or two or four second through holes 151 corresponding to the first through hole 141 can be formed accordingly.

Figure 9:
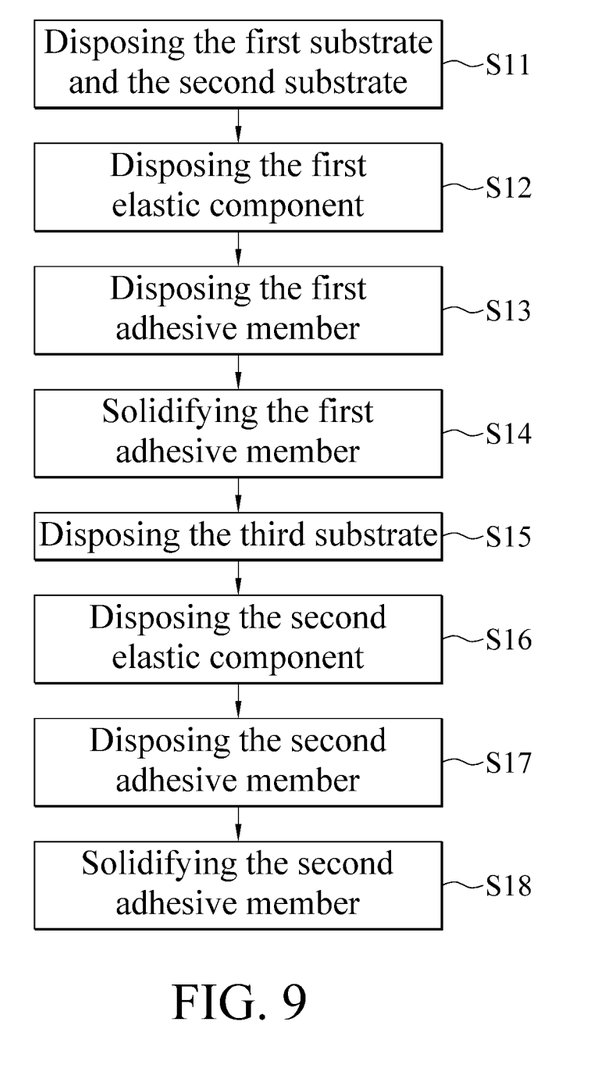
FIG. 9 illustrates a flowchart of a manufacturing method of probe card according to another exemplary embodiment of the instant disclosure.

FIG. 9 illustrates a flowchart of a manufacturing method of probe card according to another exemplary embodiment of the instant disclosure. In this embodiment, the manufacturing method comprises following steps. Firstly, disposing the second substrate 13 on the upper surface 121 of the second substrate 12 (the step S11). Then, electrically connecting the second contact 1321 of the second substrate 13 to the first contact 1211 of the first substrate 12. The electrical connection may be for example, but not limited to, physical contacting, soldering, reflow soldering, or wiring. Then, disposing the first elastic component 14 between the first substrate 12 and the second substrate 13, and the first elastic component 14 is disposed at the outer side of the second contacts 1321 of the second substrate 13 (the step S12). Then, disposing the first adhesive member 15 on the upper surface 121 of the first substrate 12 and annularly arranging the first adhesive member 15 on the side surface 133 of the second substrate 13 and at the outer side of the first elastic component 14 (the step S13). Therefore, the first adhesive member 15 can be blocked by the first elastic component 14 and prevented from flowing into the position near the second contacts 1321 between the first substrate 12 and the second substrate 13.

Then, solidifying the first adhesive member 15 (the step S14). Disposing the third substrate 16 on the upper surface 131 of the second substrate 13 (the step S15), and electrically connecting the third contact 1621 of the third substrate 16 to the fourth contact 1311 of the second substrate 13. The electrical connection may be for example, but not limited to, physical contacting, soldering, reflow soldering, or wiring. Then, disposing the second elastic component 17 between the second substrate 13 and the third substrate 16, and the second elastic component 17 is disposed at the outer side of the third contacts 1621 of the third substrate 16 (the step S16). Next, disposing the second adhesive member 18 on the upper surface 131 of the second substrate 13, and annularly arranging the second adhesive member 18 on the side surface 163 of the third substrate and at the outer side of the second elastic component 17 (the step S17). Therefore, the second adhesive member 18 can be blocked by the second elastic component 17 and prevented from flowing into the position near the third contacts 1621 between the second substrate 13 and the third substrate 16. Last, solidifying the second adhesive member 18 (the step S18). It is understood that, the steps are not necessarily executed in order. For example, in one embodiment, the steps S15 to S18 may be executed firstly, and then the steps S11 to S14 are executed.

While the instant disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A probe card, comprising:
   a probe head;
   a first substrate comprising an upper surface, wherein the upper surface comprises a plurality of first contacts;
   a second substrate disposed between the probe head and the first substrate, and disposed on the upper surface of the first substrate, wherein the second substrate comprises a lower surface and a side surface; the lower surface of the second substrate faces the upper surface of the first substrate, the lower surface of the second substrate comprises a plurality of second contacts, and each of the second contacts is electrically connected to a corresponding first contact;
   a first elastic component disposed between the upper surface of the first substrate and the lower surface of the second substrate, and disposed at an outer side of the second contacts of the second substrate; and
   a first adhesive member disposed on the upper surface of the first substrate and annular arranged on the side surface of the second substrate, wherein the first adhesive member is disposed at an outer side of the first elastic component;
   wherein the first elastic component comprises at least one first through hole, and through the at least one first through hole, an atmosphere is in communication with a space between the first substrate and the second substrate.

2. The probe card according to claim 1, wherein,
   the second substrate further comprises an upper surface and an inner wire, and the upper surface of the second substrate comprises a plurality of fourth contacts;
   the probe card further comprises:
      a third substrate disposed between the probe head and the second substrate and disposed on the upper surface of the second substrate, wherein the third substrate comprises a lower surface and a side surface; the lower surface of the third substrate faces the upper surface of the second substrate, the lower surface of the third substrate comprises a plurality of third contacts, and the internal wire is electrically connected to each of the first contacts, a corresponding second contact, a corresponding third contact, and a corresponding fourth contact;
      a second elastic component disposed on the upper surface of the second substrate and the lower surface of the third substrate, and disposed at an outer side of the third contacts of the third substrate; and
      a second adhesive member disposed on the upper surface of the second substrate and annularly arranged on the side surface of the third substrate, wherein the second adhesive member is disposed at an outer side of the second elastic component.

3. The probe card according to claim 2, wherein the first adhesive member and the second adhesive member are connected to each other to form a third adhesive member.

4. The probe card according to claim 1, wherein the first adhesive member is adjacently connected to the first elastic component and comprises at least one second through hole opposite to the at least one first through hole, and a hole diameter of the at least one second through hole is greater than or equal to a hole diameter of the at least one first through hole.

5. The probe card according to claim 4, wherein the second substrate comprises a plurality of side surfaces, the first adhesive member comprises the at least one second through hole corresponding to each of the plurality of side surfaces of the second substrate.

6. The probe card according to claim 1, wherein the first adhesive member is attached to the side surface of the second substrate, and a height of the first adhesive member is greater than or equal to one-fourth of a height of the side surface of the second substrate and is less than or equal to a height of the upper surface of the second substrate, wherein the height of the upper surface of the second substrate is from the lower surface of the second substrate to the upper surface of the second substrate.

7. The probe card according to claim 6, wherein the first adhesive member is attached to the side surface of the second substrate, and the height of the first adhesive member is greater than or equal to one-half of the height of the side surface of the second substrate and is less than or equal to the height of the upper surface of the second substrate.

8. A probe card, comprising:
   a probe head;
   a first substrate comprising an upper surface, wherein the upper surface comprises a plurality of first contacts;
   a second substrate disposed between the probe head and the first substrate, and disposed on the upper surface of the first substrate, wherein the second substrate comprises a lower surface and a side surface; the lower surface of the second substrate faces the upper surface of the first substrate, the lower surface of the second substrate comprises a plurality of second contacts, and each of the second contacts is electrically connected to a corresponding first contact;
   a first elastic component disposed between the upper surface of the first substrate and the lower surface of the second substrate, and disposed at an outer side of the second contacts of the second substrate; and
   a first adhesive member disposed on the upper surface of the first substrate and annular arranged on the side surface of the second substrate, wherein the first adhesive member is disposed at an outer side of the first elastic component;
   wherein the first elastic component has a first expansion coefficient, the first adhesive member has a second expansion coefficient, and the first expansion coefficient is less than the second expansion coefficient.

9. A probe card, comprising:
   a probe head;
   a first substrate comprising an upper surface, wherein the upper surface comprises a plurality of first contacts;
   a second substrate disposed between the probe head and the first substrate, and disposed on the upper surface of the first substrate, wherein the second substrate comprises a lower surface and a side surface; the lower surface of the second substrate faces the upper surface of the first substrate, the lower surface of the second substrate comprises a plurality of second contacts, and each of the second contacts is electrically connected to a corresponding first contact;

a first elastic component disposed between the upper surface of the first substrate and the lower surface of the second substrate, and disposed at an outer side of the second contacts of the second substrate; and a first adhesive member disposed on the upper surface of the first substrate and annular arranged on the side surface of the second substrate, wherein the first adhesive member is disposed at an outer side of the first elastic component;

wherein a first adhesive force is between the first elastic component and the second substrate, a second adhesive force is between the first adhesive member and the second substrate, and the first adhesive force is less than the second adhesive force.

10. A manufacturing method of a probe card, wherein the probe card comprises a first substrate, a second substrate, and a probe head, an upper surface of the first substrate comprises a plurality of first contacts, and a lower surface of the second substrate comprises a plurality of second contacts, wherein the manufacturing method comprises:

disposing the second substrate on the upper surface of the first substrate, wherein each of the second contacts is electrically connected to a corresponding first contact;

disposing a first elastic component between the first substrate and the second substrate and providing a first through hole on the first elastic component, wherein the first elastic component is at an outer side of the second contacts of the second substrate;

disposing a first adhesive member on the upper surface of the first substrate and providing a second through hole on the first adhesive member, so that the second through hole of the first adhesive member is in communication with the first through hole of the first elastic component, wherein the first adhesive member is annularly arranged on a side surface of the second substrate and an outer side of the first elastic component; and solidifying the first adhesive member.

11. The manufacturing method according to claim 10, wherein the probe card further comprises a third substrate, a lower surface of the third substrate comprises a plurality of third contacts, and an upper surface of the second substrate comprises a plurality of fourth contacts, wherein the manufacturing method further comprises:

disposing the third substrate on the upper surface of the second substrate, wherein each of the third contacts is electrically connected to a corresponding fourth contact;

disposing a second elastic component between the second substrate and the third substrate, wherein the second elastic component is at an outer side of the third contacts of the third substrate;

disposing a second adhesive member on the upper surface of the second substrate, wherein the second adhesive member is annularly arranged on a side surface of the third substrate and an outer side of the second elastic component; and solidifying the second adhesive member.

* * * * *